United States Patent [19]

Ziem et al.

[11] Patent Number: 4,591,409
[45] Date of Patent: May 27, 1986

[54] CONTROL OF NITROGEN AND/OR OXYGEN IN SILICON VIA NITRIDE OXIDE PRESSURE DURING CRYSTAL GROWTH

[75] Inventors: Eva A. Ziem, Garland; Graydon B. Larrabee, Dallas; David E. Witter, Richardson, all of Tex.

[73] Assignee: Texas Instruments Incorporated, Dallas, Tex.

[21] Appl. No.: 607,107

[22] Filed: May 3, 1984

[51] Int. Cl.$^4$ .............................................. C30B 27/02
[52] U.S. Cl. ................................ 156/605; 156/617 SP; 156/DIG. 89; 156/DIG. 64; 148/DIG. 22; 148/DIG. 41
[58] Field of Search ................... 156/605, 606, 617 SP, 156/DIG. 64, DIG. 83, DIG. 89; 148/DIG. 18, DIG. 22, DIG. 41

[56] References Cited

U.S. PATENT DOCUMENTS

| | | |
|---|---|---|
| 3,615,878 | 10/1971 | Chang et al. ................ 156/617 R |
| 4,090,851 | 5/1978 | Berkman et al. ............. 156/617 SP |
| 4,400,232 | 8/1983 | Ownby et al. ................ 156/601 |
| 4,415,401 | 11/1983 | Wald et al. ................... 156/608 |
| 4,443,411 | 4/1984 | Kalejs ........................... 422/246 |

FOREIGN PATENT DOCUMENTS 0155733  6/1982  German Democratic Rep. .............................. 156/617 SP

OTHER PUBLICATIONS

Chemical Abstract 96(8): 60961f, Carlberg et al., 1982.

Primary Examiner—David L. Lacey
Attorney, Agent, or Firm—Carlton H. Hoel; Robert O. Groover; James T. Comfort

[57] ABSTRACT

The disclosure relates to a method for producing single crystal silicon from a polycrystalline silicon melt wherein dopants such as oxygen and nitrogen are uniformly distributed in the crystal both along the crystal axis and radially therefrom. This is accomplished by identifying the correct species in the melt and above the melt and determining the thermochemical equilibrium between the two chemical species which lead to a change of the composition of the silicon single crystal during the entire growth process. This approach effectively circumvents the segregation coefficient during the growth process through the control of the concentration of the dopants in the melt.

20 Claims, 1 Drawing Figure

CONTROL OF NITROGEN AND/OR OXYGEN IN SILICON VIA NITRIDE OXIDE PRESSURE DURING CRYSTAL GROWTH

BACKGROUND OF THE INVENTION

1. Field of the Invention

This invention relates to the formation of substantially homogeneous single crystal silicon for use in the production of silicon slices for manufacture of semiconductor devices and the like.

2. Description of the Prior Art and Background

In the manufacture of single crystal silicon or semiconductor grade, single crystals are normally pulled from a melt of polycrystalline silicon utilizing a seed crystal and, under standard and well known conditions, pulling a single crystal of silicon from the melt. The crystal pulling normally takes place in an inert atmosphere, such as argon, and at elevated temperatures, usually in the vicinity of 1410° C. It is known that in the processing of silicon in the above described manner, the single crystal, from which slices are later taken, become contaminated with heavy metals such as iron, copper and the like which are found in the furnaces and other processing materials and equipment being utilized.

In order to getter these heavy metal impurities, it has been found that the addition of oxygen to the melt provides precipitated zones where the oxygen has been precipitated and which tends to getter the heavy metals. Furthermore, the addition of nitrogen to the melt appears to strengthen the crystal itself. It is therefore readily apparent that the controlled addition of dopants such as oxygen and nitrogen during single crystal growth of silicon is required in order to obtain a silicon slice that has improved physical strength and has internal defect and impurity gettering capabilities that are active during device manufacture. Furthermore, each slice provided from the formed single crystal of silicon must have exactly the same concentration of dopant and it must have excellent radial uniformity. This slice to slice control of dopant level can only be achieved during the crystal growth process. Current crystal growth techniques are not capable of introducing and controlling the required exact concentrations of nitrogen and oxygen throughout the crystal growth process.

The concentration of dopant in the crystal during the single crystal growth process is a direct function of the dopant concentration in the melt and the segregation coefficient of that impurity. If the segregation coefficient is greater than 1 (oxygen is 1.25), then the concentration of oxygen will be high at the top of the crystal and low at the bottom. The reverse is true for nitrogen in silicon crystal growth.

There is a thermodynamic equilibrium between the concentration of the dopant in the melt and the partial pressure of a chemically related gas species above the melt. If the partial pressure of this gas species can be precisely fixed during the growth process, then the melt concentration of that species will be fixed and the concentration of the associated dopant will thereby be fixed in the crystal.

SUMMARY OF THE INVENTION

In accordance with the present invention, there is provided a method for producing single crystal silicon from a polycrystalline silicon melt wherein dopants such as oxygen and nitrogen are uniformly distributed in the crystal both along the crystal axis and radially therefrom. This is accomplished by identifying the correct species in the melt and above the melt and determining the thermochemical equilibrium between the two chemical species which lead to a change of the composition of the silicon single crystal during the entire growth process. This approach effectively circumvents the segregation coefficient during the growth process through the control of the concentration of the dopant in the melt.

The oxygen and/or nitrogen are provided, for example, at least in part, from the quartz or silicon nitride liner inside the graphite crucible containing the melt. The dissolution of the quartz liner supplies oxygen to the crystal. Nitrogen can also be provided in this manner by utilizing a silicon nitride liner rather than the quartz liner. In each case, the formation of the crystal will take place in the presence of nitrogen gas introduced above the melt in the case of the quartz liner and with the introduction of oxygen above the melt in the case of the silicon nitride liner. This causes the formation of nitrous oxide as a result of the thermochemical equilibrium between the liquid phase and the gas phase. The nitrous oxide forms at the surface of the melt by controlling the concentration of nitrous oxide at the surface of the melt, either by adding nitrous oxide or by adding nitrogen for reaction with oxygen in the melt or by adding a mixture of nitrogen and oxygen or by adding oxygen for reaction with nitrogen in the melt. All of these procedures operate toward establishing the equilibrium gas phase over the melt. This controls the amount of nitrogen and oxygen dissolved in the melt at any time.

The amounts of oxygen and nitrogen in the melt tend to be mutually exclusive. Where there is a high oxygen partial pressure there will be a low nitrogen partial pressure because nitrogen is removed from the melt to form the nitrous oxide. Where there is a high nitrogen partial pressure, there is a low oxygen partial pressure for the same reason.

To control the nitrogen level in silicon, it is necessary to establish the thermochemical correlations between nitrogen content in the melt and a gas species containing nitrogen above the melt. In order to simultaneously control both nitrogen and oxygen, the gas species must be one of the oxides of nitrogen. Examination of the thermochemistry of all the gaseous oxides of nitrogen: $N_2O_5$, $N_2O_4$, $N_2O_3$, NO and $N_2O$ shows that only $N_2O$ has a measurable pressure in the Si-C-O-N system at the melting point (1685° K.) of silicon. Appendix 1 shows an example of the SOLGAS calculations which support this conclusion.

Appendix 2 is an example of the calculation of the equilibrium between silicon and the dopants oxygen, carbon and nitrogen which shows the gas and liquid phase composition. It also shows that invariant solids can be formed during the process of establishing the equilibrium state. In this example, the silicon melt is saturated with nitrogen (120 ppma) and silicon nitride ($Si_3N_4$) begins to be formed in the melt. A large amount of nitrous oxide in the system causes this nitrogen saturation in the melt resulting in the precipitation of $Si_3N_4$ and the depletion of oxygen in the melt. When the nitrous oxide pressures are lowered, the nitrogen level in the melt is lowered and no $Si_3N_4$ precipitates in the melt. These calculations can be used to establish a thermochemical model of this system.

BRIEF DESCRIPTION OF THE DRAWING

The drawing is a schematic diagram of a system utilizing the present invention.

DESCRIPTION OF THE PREFERRED EMBODIMENT

Figure 1:
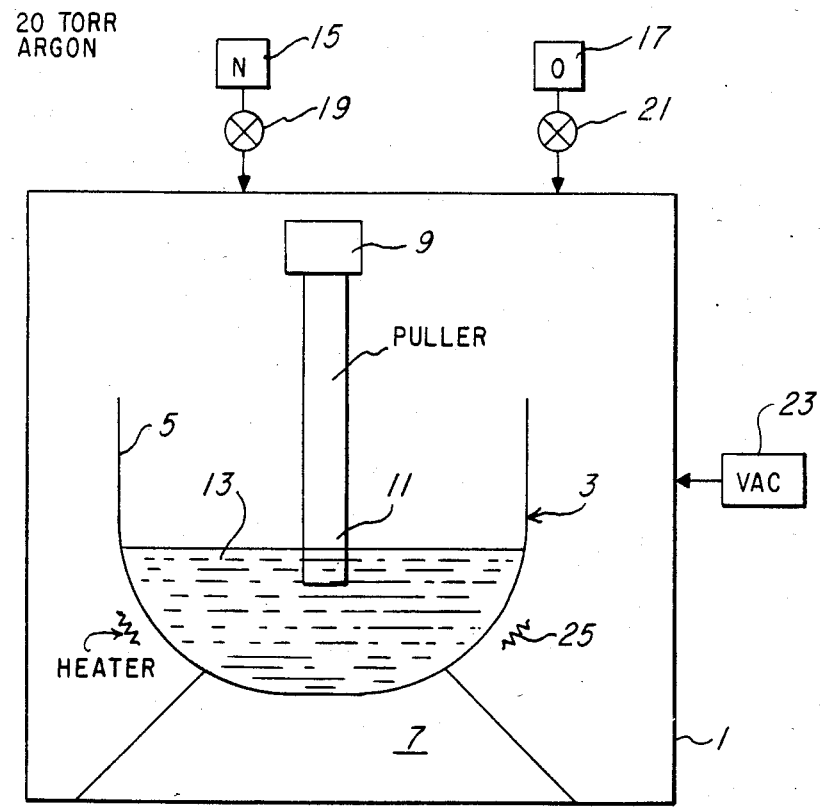

Referring now to the FIGURE, there is shown a schematic diagram of a standard crystal puller arrangement for use in conjunction with the present invention. The system includes an enclosure 1 within which is provided a crucible 3 formed of carbon with an interior liner 5 formed of quartz. The crucible 3 is positioned on a support 7 and a standard crystal puller mechanism 9 with a crystal 11 being pulled from the melt 13 is shown. Also shown are feeders 15 for feeding nitrogen into the system and 17 for feeding oxygen into the system, there being a valve 19 in the case of the nitrogen and 21 in the case of the oxygen for controlling the flow of the respective gases into the chamber 1. Also shown in a vacuum pump 23 for evacuating the chamber 1 to the desired vacuum level. A heater mechanism 25 is positioned about the crucible 3 to inductively heat the melt 13 therein to the desired temperature.

To form a crystal in accordance with the present invention utilizing the above described system, polycrystalline silicon is entered into the crucible 3 in the melt 13 at room temperature. The system 1 is then sealed up and pumped down by means of the vacuum pump 23 to evacuate the system and remove air therefrom. The conditions desired in the melt are then established under vacuum conditions in order to maintain the system clean and then come up to the proper melt temperature. At the melt temperature, the necessary gases such as nitrogen from nitrogen feeder 15 and/or oxygen from oxygen feeder 17 are introduced into the system. (The system could start out with the gases introduced therein at room temperature with the temperature then being raised to the final operating temperature for the melt.) These amounts are determined by the model presented in Appendix 1. Also provided in Appendix 2 is a set of mathematical correlations which is taken from the SOLGAS computer program. The SOLGAS program is well known in the art to find the equilibrium conditions in the systems containing gases, solids, and liquids together. The thermochemical constants are recorded in tables as a function of temperature so that a determination can be made as to what the equilibrium condition would be when the atoms are placed together in a confined volume as an isolated system. The SOLGAS calculations herein are restricted specifically to the materials utilized in the present system.

Once the system of the FIGURE is set up as noted above, the conditions are made to conform to the following mathematical correlations in the addition of oxygen and/or nitrogen to the system at the temperature and pressure therein and the experimental data is examined: The nitrous oxide gas, oxygen and nitrogen in the melt must be established in order to control the concentrations of oxygen and/or nitrogen in the single crystal silicon. When the equilibrium:

$$O(Si) + 2N(Si) = N_2O(gas) \tag{1}$$

was examined at 1685° K. the following equations were derived from the SOLGAS calculations.
The constant of reaction (1): K at silicon melting point is equal to:

$$K = p(N_2O)/O(Si)*(N(Si))^2 = 2.0325E-05 \tag{2}$$

The equilibrium partial pressure of nitrous oxide in the ambient atmosphere above the melt can be expressed as the following:

$$p(N_2O) = 2.0325E-05 * O(Si) * (N(Si))^2 \tag{3}$$

Also the nitrogen concentration in the melt is obtained:

$$N(Si) = 221.8118 * (p(N_2O)/O(Si))^{\frac{1}{2}} \tag{4}$$

Or the oxygen concentration in the melt is equal to:

$$O(Si) = 49200.429 * p(N_2O)/(N(Si))^2 \tag{5}$$

Knowing the nitrogen and oxygen segregation coefficient between molten and solid silicon (0.0007 and 1.25 respectively) the following correlations between nitrous oxide pressure and nitrogen concentration in silicon crystal can be calculated:

$$N(Si) = 0.15552 * (p(N_2O)/O(Si))^{\frac{1}{2}} \tag{6}$$

$$O(Si) = 0.02419 * p(N_2O)/(N(Si))^2 \tag{7}$$

Pressure of $N_2O$ is expressed in atm, oxygen and nitrogen concentration is in ppma and reaction constant K is in atm/(ppma)$^3$.

After the polycrystalline silicon has melted to form the melt 13, a seed crystal is placed in contact with the melt 13 and a crystal 11 is pulled by means of a crystal puller 9. During this crystal growth process, there is an equilibrium segregation coefficient of the nitrogen as to whether it will go into the crystal or whether it will stay in the melt. If the pressure in the melt is increased, then the concentration of gas in the melt is increased and the required oxygen partial pressure above the surface of the melt is increased. Therefore, by virtue of increasing concentration, material is being supplied from an equilibrium condition because some of the material is being frozen out. Gas is being applied to the atmosphere which then can be pumped away as vacuum so that the pressure in the chamber 1 is being controlled. Also, material is added, if necessary, due to its being depleted from the melt into the crystal. So oxygen is being segregated into the crystal, the crystal is being pulled and more oxygen is being pumped into the system to replace the oxygen segregated into the crystal. This is all apparent from the model in Appendix 3. The gases are introduced to maintain a layer of nitrous oxide above the melt. The nitrous oxide is measured on-line by means of a mass spectrometer on the system wherein gas can be removed from the surface of the melt and fed back into a lower pressure quadripole electron multiplier mass spectrometer (not shown). From these results, the amount of nitrogen and/or oxygen being introduced to the system is controlled on-line by a mass flow controller (not shown). Also, the pressure is controlled on-line by means of the vacuum pump.

Identifying the correct species in the melt and above the melt and determining the thermochemical equilibrium between the two chemical species leads to a way of changing the composition of the silicon single crystal during the entire crystal growth process. This approach effectively circumvents the segregation coefficient during the growth process through the control of the concentration of the dopant in the melt.

In summary, depending on the crystal growth conditions (e.g crucible material), the nitrogen concentration (for constant oxygen) or the oxygen concentration (for constant nitrogen) can be controlled by changing the nitrous oxide partial pressure above the melt.

When a quartz crucible dissolves with a constant rate it fixes the oxygen at a constant level and the equilibrium in the system adjusts to this oxygen value. The nitrogen concentration in the melt, the $N_2O$ partial pressure and the other species pressures or concentrations are established in the process. By changing the nitrous oxide pressure it is possible to change the mass fractions of all species and this will force the system to new steady state equilibrium following equation (3).

The same conditions prevail when a silicon nitride crucible dissolves at a constant rate. This fixes the nitrogen at a constant level and the change in the $N_2O$ pressure causes the oxygen concentration in the melt to change according to equation (3).

When there is not an outside source of oxygen or nitrogen in the melt there is one unique equilibrium state and one unique oxygen and nitrogen concentration in the system. Changing the nitrous oxide partial pressure changes the concentrations of oxygen and nitrogen in the melt following equation (3).

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

APPENDIX 1

SI/H/HE/C/O/N EQUILIBRIUM SYSTEM

| T = 1685.00° K. P = 2.600E−02 ATM | |
|---|---|
| GAS PHASE: | P/ATM |
| N2O5 | 0.29893E−28 |
| N2O4 | 0.78851E−22 |
| N2O3 | 0.37603E−15 |
| NO | 0.55052E−15 |
| N2O | 0.46557E−02 |
| N2 | 0.38203E−05 |
| He | 0.17041E−01 |
| CO | 0.42995E−02 |
| CO2 | 0.29511E−08 |
| O2 | 0.15184E−20 |

APPENDIX 2

SOLGAS EQUILIBRIUM CALCULATIONS

TABLE

SI/H/He/C/O/N EQUILIBRIUM SYSTEM
T = 1685.00° K.
P = 2.600D-02 ATM

| | IN/MOLE | OUT/MOLE | P/ATM | ACTIVITY |
|---|---|---|---|---|
| GAS PHASE: | | | | |
| He | 0.11920E+02 | 0.11920E+02 | 0.12331E−01 | 0.12331E−01 |
| CO2 | 0.00000E+00 | 0.63559E−13 | 0.65752E−16 | 0.65752E−16 |
| CO | 0.00000E+00 | 0.10939E−04 | 0.11316E−07 | 0.11316E−07 |
| SiO(g) | 0.00000E+00 | 0.97627E−02 | 0.10100E−04 | 0.10100E−04 |
| O2 | 0.60000E+01 | 0.10518E−21 | 0.10881E−24 | 0.10881E−24 |
| Si(g) | 0.00000E+00 | 0.47273E−03 | 0.48904E−06 | 0.48904E−06 |
| H2 | 0.50000E−01 | 0.50000E−01 | 0.51725E−04 | 0.51725E−04 |
| H2O | 0.00000E+00 | 0.10255E−08 | 0.10609E−11 | 0.10609E−11 |
| HNO2 | 0.00000E+00 | 0.40284E−29 | 0.41674E−32 | 0.41674E−32 |
| NH3 | 0.00000E+00 | 0.47671E−09 | 0.49316E−12 | 0.49316E−12 |
| N2O | 0.00000E+00 | 0.11990E+02 | 0.12404E−01 | 0.12404E−01 |
| N2 | 0.26750E+02 | 0.11622E+01 | 0.12024E−02 | 0.12024E−02 |
| LIQUID PHASE: | | | MOLE FRACTION | |
| O(Si) | 0.00000E+00 | 0.11858E−04 | 0.42366E−07 | 0.42366E−07 |
| C(Si) | 0.00000E+00 | 0.88906E−03 | 0.31764E−05 | 0.31764E−05 |
| N(Si) | 0.00000E+00 | 0.33618E−01 | 0.12011E−03 | 0.12011E−03 |
| SI | 0.30025E+03 | 0.27987E+03 | 0.99988E+00 | 0.99988E+00 |
| INVIARIANT SOLIDS: | | | | |
| Si3N4 | 0.00000D+00 | 0.67904D+01 | | |
| Si2N2O | 0.00100D+00 | 0.00000D+00 | | |
| C | 0.90000D−03 | 0.00000D+00 | | |
| SiC | 0.00000D+00 | 0.00000D+00 | | |
| SiO2 | 0.00000D+00 | 0.00000D+00 | | |

APPENDIX 3

O(Si)—N(Si)—$N_2O$ SYSTEM ANALYSIS

The following table shows the equilibrium nitrogen concentration in the melt and crystal versus the equilibrium $p(N_2O)$ in the gas phase above the melt when oxygen content is held at a constant value. Experimentally this condition can be approached through controlled dissolution of the quartz crucible containg the melt. In this case a value of 29 ppma oxygen was chosen for the melt.

TABLE

NITROGEN IN MOLTEN SILICON AND
SILICON CRYSTAL AS A FUNCTION OF NITROUS
OXIDE PARTIAL PRESSURE ABOVE THE
MELT IN THE AMBIENT ATMOSPHERE
AT SILICON MELTING POINT ( 1685° K. )
FOR CONSTANT OXYGEN ( 29 ppma in the melt )

| nitrogen in the melt | nitrogen in the crystal | | $N_2O$ partial pressure |
|---|---|---|---|
| ppma | ppma | atoms/cc | atm |
| 120 (soluble. limit) | 0.084 | 4.5E+15 | 8.475 |
| 100 | 0.070 | 3.5E+15 | 5.886 |
| 50 | 0.035 | 1.9E+15 | 1.471 |
| 20 | 0.014 | 7.5E+14 | 0.235 |

TABLE -continued

NITROGEN IN MOLTEN SILICON AND
SILICON CRYSTAL AS A FUNCTION OF NITROUS
OXIDE PARTIAL PRESSURE ABOVE THE
MELT IN THE AMBIENT ATMOSPHERE
AT SILICON MELTING POINT ( 1685° K. )
FOR CONSTANT OXYGEN ( 29 ppma in the melt )

| nitrogen in the melt ppma | nitrogen in the crystal ppma | atoms/cc | $N_2O$ partial pressure atm |
|---|---|---|---|
| 10 | 0.007 | 3.8E+14 | 0.059 |

This table shows that there is an ambient gas pressure problem that arises under these conditions. The pressure of $N_2O$ exceeds ambient pressure during the silicon crystal growth, i.e., 1 atm. This means that under equilibrium conditions it is impossible to achieve a nitrogen saturation (120 ppma) at 29 ppma of oxygen in the melt and still maintain a pressure of about 1 atm.

The following table shows the equilibrium nitrogen and oxygen concentrations in the silicon melt for nitrous oxide partial pressures of 1 and 0.026 atm. The nitrogen and oxygen concentrations are inversely proportional (see equation (2) ) and at constant nitrous oxide pressure are limited between two values. At 1 atm the highest nitrogen concentration is equal to the solubility limit (120 ppma). This corresponds to an oxygen concentration of 3.4 ppma and this concentration cannot be lowered until the nitrous oxide pressure is lowered. As the concentration of oxygen increases in the melt the nitrogen concentration of the melt decreases. When the oxygen content achieves its limit (41.7 ppma) the nitrogen concentration in the melt cannot be lower than 34.3 ppma. The only way to lower the nitrogen concentration is to lower the nitrous oxide pressure.

TABLE

NITROGEN AND OXYGEN IN MOLTEN SILICON
IN EQUILIBRIUM WITH NITROUS OXIDE
IN THE AMBIENT ATMOSPHERE
AT SILICON MELTING POINT ( 1685° K. )

| nitrogen in the melt ppma | oxygen in the melt ppma | $N_2O$ partial pressure atm |
|---|---|---|
| 120 (solub. limit) | 3.42 | 1.0 |
| 120 | 0.09 | 0.026 |
| 100 | 4.92 | 1.0 |
| 100 | 0.13 | 0.026 |
| 50 | 19.68 | 1.0 |
| 50 | 0.51 | 0.026 |
| 34.3 | 41.7 (solub. limit) | 1.0 |
| 0.9 | 41.7 | 0.026 |

What is claimed is:

1. A method of forming a single crystal of silicon having substantially uniform physical properties throughout the crystal, comprising the steps of:
   (a) providing a silicon melt,
   (b) adding a predetermined dopant to said melt,
   (c) providing a gas over and in contact with said melt, which gas is chemically related to said dopant, at a continual partial pressure to maintain the melt concentration of said dopant at a substantially fixed value during silicon crystal formation; and
   (d) forming a silicon crystal from said melt while said gas is over and in contact with said melt.

2. The method of claim 1 wherein said dopant is taken from the class consisting of oxygen and nitrogen and combinations thereof.

3. The method of claim 2 wherein said dopant is provided at least in part from a liner of a crucible holding said melt.

4. The method of claim 3 wherein the concentration of said dopant with respect to both the gas and the melt is maintained at thermodynamic equilibrium during formation of the silicon crystal.

5. The method of claim 4 wherein said gas is taken from the class consisting of oxygen, nitrogen, nitrous oxide and combinations thereof.

6. The method of claim 3 wherein said gas is taken from the class consisting of oxygen, nitrogen, nitrous oxide and combinations thereof.

7. The method of claim 2 wherein the concentration of said dopant with respect to both the gas and the melt is maintained at thermodynamic equilibrium during formation of the silicon crystal.

8. The method of claim 7 wherein said gas is taken from the class consisting of oxygen, nitrogen, nitrous oxide and combinations thereof.

9. The method of claim 2 wherein said gas is taken from the class consisting of oxygen, nitrogen, nitrous oxide and combinations thereof.

10. The method of claim 1 wherein said dopant is provided at least in part from a liner of a crucible holding said melt.

11. The method of claim 10 wherein the concentration of said dopant with respect to both the gas and the melt is maintained at thermodynamic equilibrium during formation of the silicon crystal.

12. The method of claim 11 wherein said gas is taken from the class consisting of oxygen, nitrogen, nitrous oxide and combinations thereof.

13. The method of claim 10 wherein said gas is taken from the class consisting of oxygen, nitrogen, nitrous oxide and combinations thereof.

14. The method of claim 1 wherein the concentration of said dopant with respect to both the gas and the melt is maintained at thermodynamic equilibrium during formation of the silicon crystal.

15. The method of claim 14 wherein said gas is taken from the class consisting of oxygen, nitrogen, nitrous oxide and combinations thereof.

16. The method of claim 1 wherein said gas is taken from the class consisting of oxygen, nitrogen, nitrous oxide and combinations thereof.

17. A method of forming a single crystal of silicon having substantially uniform physical properties throughout the crystal, comprising the steps of:
   (a) providing a silicon melt,
   (b) adding a predetermined dopant to said melt taken from the class consisting of nitrogen and oxygen,
   (c) providing a gas over and in contact with said melt, which gas is taken from the class consisting of nitrogen and nitrous oxide when said dopant is oxygen and taken from the class consisting of oxygen and nitrous oxide when said dopant is nitrogen at a continual partial pressure to maintain the melt concentration of said dopant at a substantially fixed value during silicon crystal formation; and
   (d) forming a silicon crystal from said melt while said gas is over and in contact with said melt.

18. The method of claim 17 wherein said dopant is provided at least in part from a liner of a crucible holding said melt.

19. The method of claim 18 wherein the concentration of said dopant with respect to both the gas and the melt is maintained at thermodynamic equilibrium during formation of the silicon crystal.

20. The method of claim 17 wherein the concentration of said dopant with respect to both the gas and the melt is maintained at thermodynamic equilibrium during formation of the silicon crystal.

* * * * *